United States Patent
Margolis

(10) Patent No.: US 7,869,558 B2
(45) Date of Patent: Jan. 11, 2011

(54) METHOD AND APPARATUS FOR CALIBRATING A COUNTING CIRCUIT

(75) Inventor: Evgeni Margolis, Gilbert, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 43 days.

(21) Appl. No.: 12/464,581

(22) Filed: May 12, 2009

(65) Prior Publication Data

US 2010/0290580 A1 Nov. 18, 2010

(51) Int. Cl.
*G06M 3/00* (2006.01)
*H03K 21/40* (2006.01)

(52) U.S. Cl. .......................... 377/28; 377/29
(58) Field of Classification Search .......... None
See application file for complete search history.

(56) References Cited

U.S. PATENT DOCUMENTS

| | | | |
|---|---|---|---|
| 5,473,651 A * | 12/1995 | Guzinski et al. ............. 377/29 |
| 5,789,969 A * | 8/1998 | Davis et al. ................ 327/276 |
| 6,304,119 B1 | 10/2001 | Tseng et al. |
| 6,327,223 B1 | 12/2001 | Elfman |
| 6,473,607 B1 | 10/2002 | Shohara et al. |
| 6,633,825 B2 | 10/2003 | Burns et al. |
| 6,662,107 B2 | 12/2003 | Gronemeyer |
| 6,925,139 B2 | 8/2005 | Lendre et al. |
| 7,123,190 B1 | 10/2006 | McBurney et al. |
| 2002/0130252 A1* | 9/2002 | Funakawa ................... 250/226 |
| 2008/0222440 A1 | 9/2008 | Jones et al. |
| 2008/0246549 A1 | 10/2008 | Chen et al. |
| 2009/0085685 A1 | 4/2009 | Guo et al. |
| 2009/0146744 A1* | 6/2009 | Yang et al. .................... 331/44 |

* cited by examiner

*Primary Examiner*—Tuan Lam
(74) *Attorney, Agent, or Firm*—Susan C. Hill; Joanna G. Chiu

(57) ABSTRACT

Timing circuitry may use control circuitry to control calibration circuitry to calibrate a counter so that an adder and a calibration period counter are not required. Concatenation circuitry may be used to concatenate a portion of the counter value and the calibration value to provide a calibrated value to the counter. The results from match circuitry may be used to provide status and control information to a calibration history bit and to an enable circuit. The counter may be an up counter or a down counter.

20 Claims, 4 Drawing Sheets

METHOD AND APPARATUS FOR CALIBRATING A COUNTING CIRCUIT

BACKGROUND

1. Field

This disclosure relates generally to a counting circuit, and more specifically, to a method and apparatus for calibrating a counting circuit.

2. Related Art

Many applications using integrated circuits make use of counting circuitry that may be used in a variety of applications. Some applications may require calibration to improve the accuracy of the count value.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
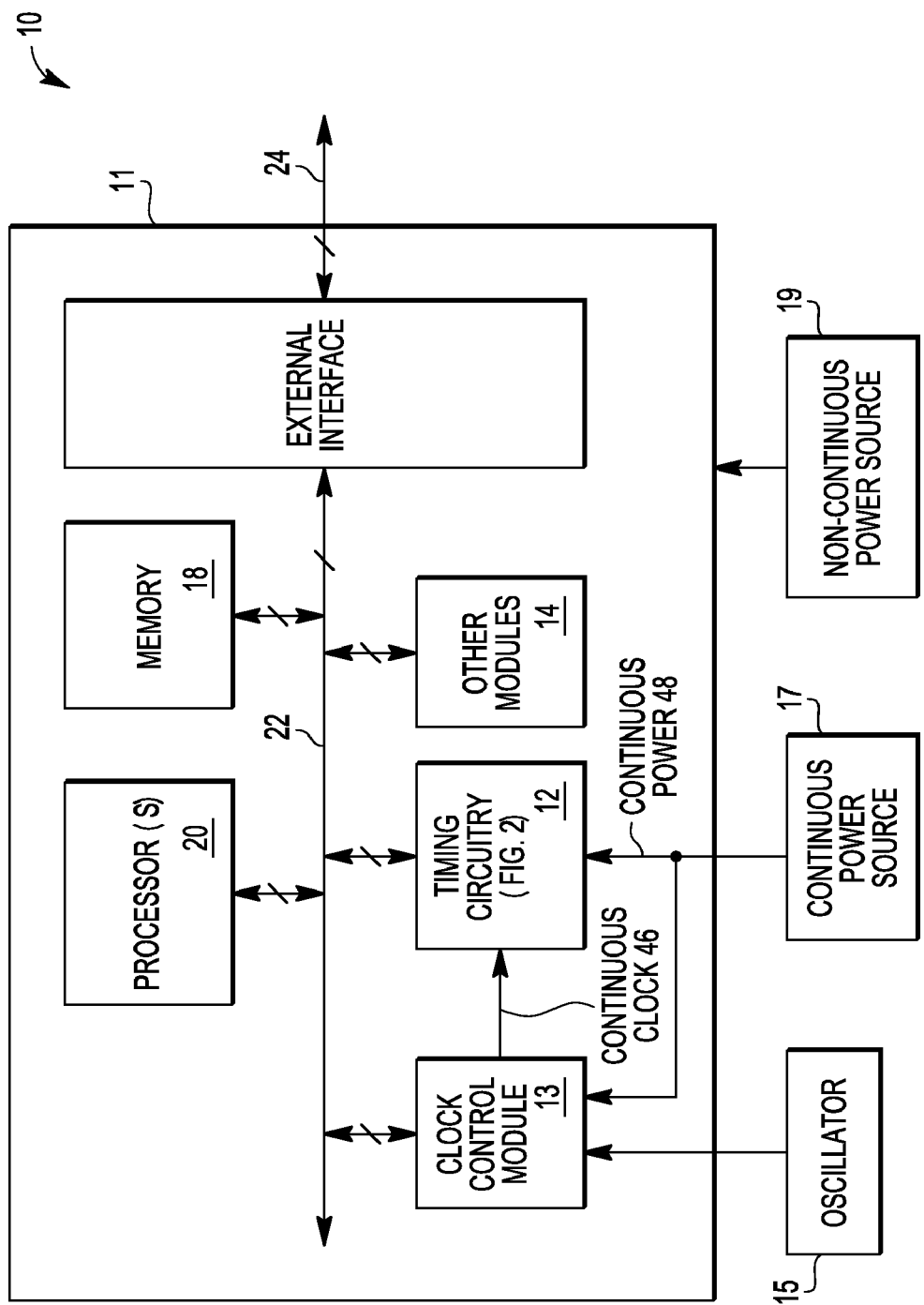
FIG. 1 illustrates, in block diagram from, an information processing system in accordance with one embodiment.

Some integrated circuit applications require a secure and certifiable time, such as, for example, applications which implement various Digital Rights Management (DRM) schemes. In order to support DRM rules and requirements, a trusted and very accurate time source is needed. In some embodiments, counting circuitry may be used to provide this secure and certifiable time. In addition, some applications may require calibration to improve the accuracy of the count value due to drift in the frequency of the clock signal used to increment/decrement the counter. Such a drift in the clock signal may be caused by a drift in the frequency of an oscillator output used to generate the clock signal. For example, the frequency of an oscillator output may drift or vary due to changes in operating temperature, operating voltage, etc.) To compensate for the potential drift in the clock signal used to increment/decrement a counter, a clock calibration mechanism is needed to appropriately adjust the counter value.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Brackets are used herein to indicate the conductors of a bus or the bit locations of a value. For example, "bus 60 [7:0]" or "conductors [7:0] of bus 60" indicates the eight lower order conductors of bus 60, and "address bits [7:0]" or "ADDRESS [7:0]" indicates the eight lower order bits of an address value. The symbol "$" preceding a number indicates that the number is represented in its hexadecimal or base sixteen form. The symbol "%" preceding a number indicates that the number is represented in its binary or base two form.

FIG. 1 illustrates an information processing system 10 in accordance with one embodiment. In the illustrated embodiment, system 10 comprises an integrated circuit (IC) 11 which is coupled to oscillator circuit 15 to receive an oscillator output signal, is coupled to continuous power source 17 to receive continuous power (VDDC) via conductor 48, and is coupled to a non-continuous power source 19 to receive a non-continuous power source 19. In some embodiments, the continuous power source 17 may be implemented using a backup battery, such as, for example, a coin-cell battery. In the illustrated embodiment, once continuous power source 17 begins to provide continuous power 48 to power up timing circuitry 12, the provision of power 48 to circuitry 12 is continuous and is not interrupted. In the illustrated embodiment, non-continuous power source 19 is used to provide power to the remainder of the circuitry on integrated circuit 11 (other than circuitry 12), and the provision of power from power source 19 may be interrupted (i.e. may be non-continuous).

In the illustrated embodiment, integrated circuit 11 comprises a clock control module 13, timing circuitry 12, other modules 14, an external interface 16, memory 18, and one or more processors 20 which are all bi-directionally coupled to each other by way of interconnect 22. In alternate embodiment, fewer, more, or different modules than those illustrated in FIG. 1 may be used. In one embodiment, interconnect 22 comprises one or more busses and/or one or more additional conductors.

In the illustrated embodiment, clock control module 13 receives an oscillator output signal from oscillator 15 and provides one or more system clocks to the rest of the circuitry on IC 11 via interconnect conductors 22. These one or more system clocks are used to clock the circuitry (other than timing circuitry 12) on IC 11. One or more of these system clocks may be stopped in order to reduce the power consumed by IC 11. In addition, clock circuitry module 13 provides a continuous clock signal via conductor 46 to timing circuitry 12. This continuous clock signal 46 is never stopped as long as the continuous power source 17 is providing power. In the illustrated embodiment, the continuous power source 17 is also coupled to the portion of the clock module circuit 13 that is used to generate and provide the continuous clock 46 to timing circuitry 12.

In the illustrated embodiment, one or more processors 20 are capable of executing a plurality of instructions. Memory 18 may comprise any type of storage circuit, and alternate embodiments of memory 18 may comprise a plurality of types of storage circuitry. Some embodiments of IC 10 may comprise an external interface 16 for communicating external to IC 11 (e.g. via integrated circuit pins, bumps, or any type of electrically conductive terminals 24). In alternate embodiments, one or more of modules 14, 18, and/or 20 may be coupled external to IC 11 by way of one or more integrated circuit terminals (not shown). In addition, clock control module 13 and timing circuitry 12 may be coupled to other integrated circuit terminals (not shown) to receive and/or provide signals external from/to IC 11.

Figure 2:
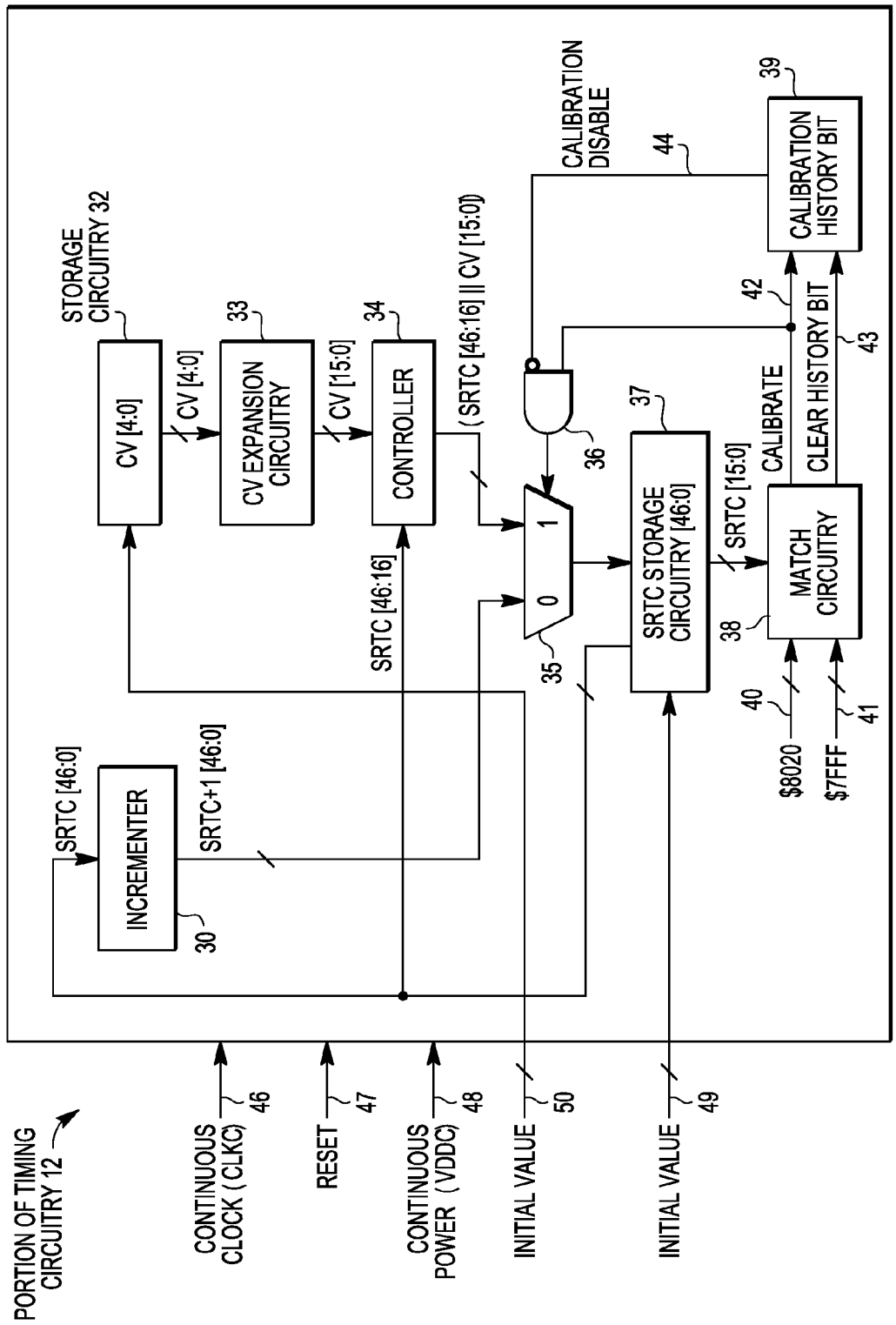
FIG. 2 illustrates, in partial block diagram from and partial schematic diagram form, a portion of timing circuitry 12 of FIG. 1 in accordance with one embodiment.

FIG. 2 illustrates a portion of timing circuitry 12 of FIG. 1 in accordance with one embodiment. In the illustrate embodiment, timing circuitry 12 receives a reset signal via conductor 47, receives an initial value for the SRTC (Secure Real Time Counter) storage circuitry 37 via conductors 49, and receives an initial value for the calibration value (CV) storage circuitry 32 via conductors 50. In one embodiment, the initial values 49 and 50 are stored in memory 18 (see FIG. 1) and are provided to timing circuitry 12 in response to execution, by a processor 20, of one or more register load operations. In one embodiment, CV storage circuitry 32 and SRTC storage circuitry 37 may be implemented as writeable registers in the memory map of IC 11. In some embodiments, the initial values 49 and 50 may be provided to timing circuitry 12 from external to the IC 11 by way of terminals 24, external interface 16, and interconnect 22. Alternate embodiments may allow initial values 49, 50 to be stored in circuitry 37, 32, respectively, in yet other ways. Note that for one embodiment, SRTC storage circuitry 37 and CV storage circuitry 32 are only initialized once after continuous power 48 is first provided to timing circuitry 12 (see block 106 in FIG. 3). Alternate embodiments may initialize circuitry 37 and 32 in a different manner.

Figure 3:
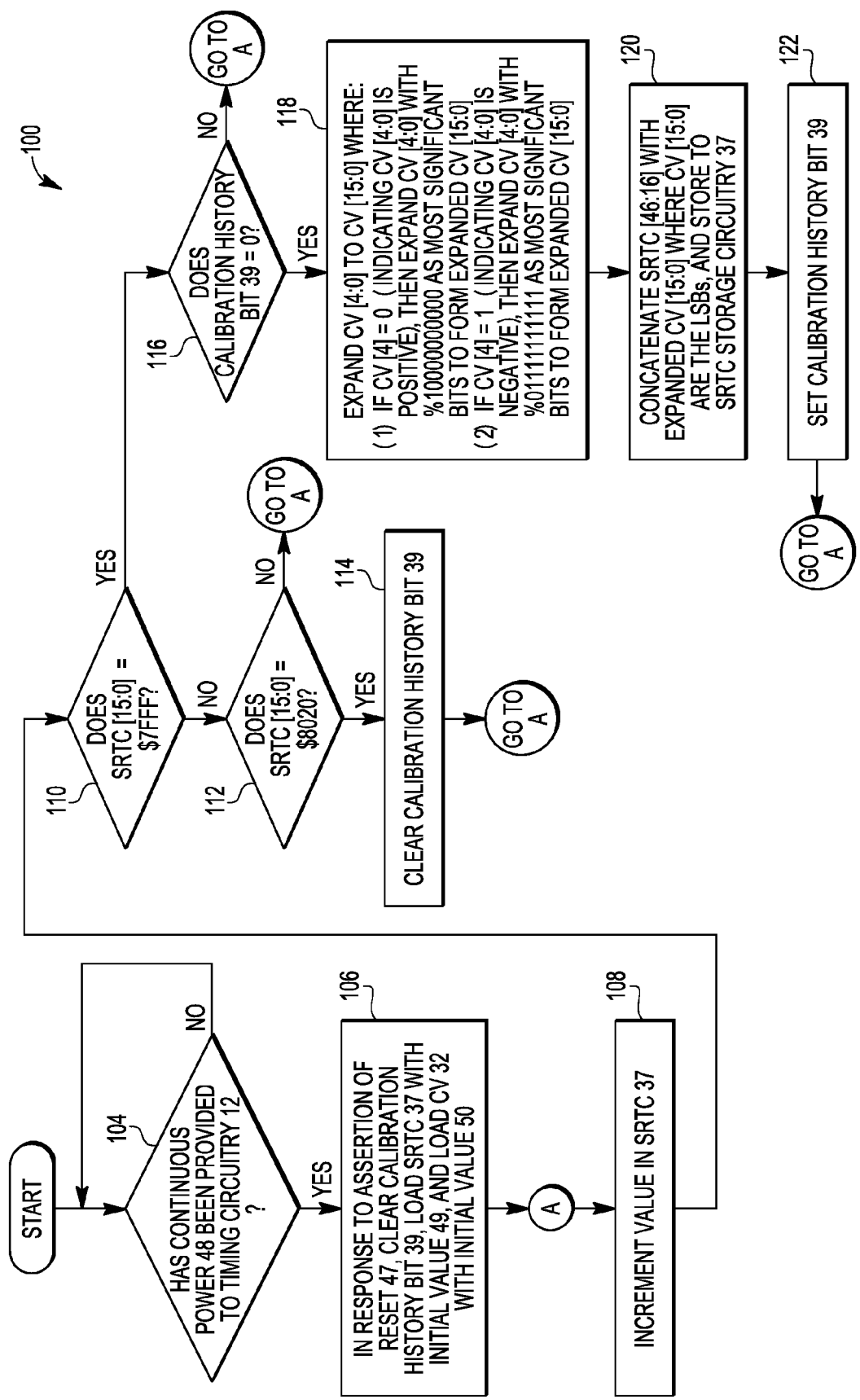
FIG. 3 illustrated, in flow diagram form, a method 100 that may be performed by the circuitry of FIGS. 1 and 2 in accordance with one embodiment.

In one embodiment, the assertion of reset signal 47 causes the calibration history bit 39 to be cleared, causes the SRTC storage circuitry 37 to be loaded with its initial value 49, and causes the CV storage circuitry 32 to be loaded with its initial value 50 (see block 106 in FIG. 3). Alternate embodiments may have reset 47 affect timing circuitry 12 in a different manner. The reset signal 47 may be provided to timing circuitry 12 via interconnect 22. In one embodiment, reset signal 47 is generated and provided by reset circuitry (not shown) within external interface 16. For some embodiments, reset signal 47 is asserted in response to a reset integrated circuit terminal (24) being asserted. For some embodiment, a reset signal 47 is asserted in response to timing circuitry 12 receiving continuous power 48 for the first time.

For the embodiment of timing circuitry 12 illustrated in FIG. 2, the counter is 47 bits, the calibration value is 5 bits, and the calibration value is expanded to 16 bits before concatenation. However, alternate embodiments of timing circuitry 12 may use any desired and appropriate number of bits for the counter, the calibration value, and the expanded calibration value. The number of bits used for each of these values will be determined by the applications in which timing circuitry 12 is used. Thus, the number of bits referred to in FIG. 2 are merely for illustrative purposes, and alternate embodiments may use any desired and appropriate number of bits.

Timing circuitry 12 comprises SRTC storage circuitry 37 that may be used to store the counter value SRTC[46:0]. SRTC 37 then provides the counter value SRTC[46:0] to incrementer 30 and to match circuitry 38. In addition, a portion (less than all) of the bits of the SRTC value SRTC[46:16] are provided to concatenator 34.

In the illustrated embodiment, the calibration value stored in storage circuitry 32 is not changed once it is initialized with its initial value 50. However, alternate embodiments may allow for some modification of the calibration value, if needed or desired. In the illustrated embodiment, the calibration value is 5 bits and is provided to CV expansion circuitry 33. Block 118 in FIG. 3 describes how CV expansion circuitry 33 may expand the 5 bit calibration value to 16 bits by adding eleven bits as the most significant bits for the illustrated embodiment. Alternate embodiments may expand the calibration value in a different manner (e.g. more bits, fewer bits, expand using different values). Also, some embodiments may not need to expand the calibration value at all.

In the illustrated embodiment, the expanded calibration value CV[15:0] is provided to concatenator 34. Concatenator 34 then concatenates the calibration value and the upper bits of the counter value to form a concatenated value (SRTC[46:16] II CV[15:0]). This concatenated value is then provided as one input to multiplexer (MUX) 35. The other input to MUX 35 is the output of incrementer 30, namely the counter value incremented by one (SRTC+1[46:0]). In the illustrated embodiment, the counter value incremented by one (SRTC+1[46:0]) is provided by MUX 35 to SRTC storage circuitry 37 whenever the output of gate 36 is negated (i.e. calibration is not currently being performed). The output of gate 36 is asserted only when calibration is enabled. When calibration is enabled and the output of gate 36 is asserted, MUX 35 provides the output of concatenator 34 to SRTC storage circuitry 37.

In one embodiment, match circuitry 38 receives a portion of the counter value from circuitry 37 and compares that portion of the counter value to one or more provided values. These provided values may be programmable (e.g. via register load operations executed by processor 20), may be provided from a source external to IC 11 (see FIG. 1), may be a constant predetermined value, or may be provided in any desired and appropriate manner. In the illustrated embodiment, the sixteen least significant bits of the counter value from circuitry 37 are compared to $7FFF to determine if calibration should occur. If the SRTC[15:0] matches $7FFF, the calibrate signal 42 is asserted. If the calibration history bit 39 is storing a "0" when the calibrate signal 42 is asserted, then calibration occurs and the output of the concatenator 34 is provided as the input to SRTC storage circuitry 37. Assertion of the calibration signal 42 also causes the calibration history bit 39 to be set (i.e. to store a "1"). The calibration history bit 39 will disable further calibrations until the calibration history bit 39 is subsequently cleared. In the illustrated embodiment, the calibration history bit 39 is cleared when the clear history bit signal 43 is asserted. The clear history bit signal 43 is asserted when the least significant 16 bits of the counter value SRTC[15:0] match $8020. Again, alternate embodiments may use different match values than those illustrated, and/or may use a different number of bits than those illustrated.

In the illustrated embodiment, match circuitry 38 receives one or more match inputs and provides a calibrate signal 42 and a clear history bit signal 43 to the calibration history bit 39. In one embodiment, the calibration history bit 39 may comprise a flip-flop for storing the value of the calibration history bit. In one embodiment, a NAND gate 36 may be coupled to the match circuitry 38 to receive the calibration signal 42 at a non-inverting input, and may be coupled to the calibration history bit 39 to receive a calibration disable signal 44 at an inverting input. The output of NAND gate 36 is coupled to the select input of MUX 35. The output of NAND gate 36 is a "1" (i.e. calibration occurs) when the calibration signal 42 is asserted and when the calibration history bit 39 is cleared.

In alternate embodiments, timing circuitry 12 may utilize a down counter instead of an up counter. Using a down counter instead of an up counter is well known for counting, and such alternate embodiments are within the scope of this document. In the case of a down counter, timing circuitry 12 may use a decrementer (not shown) instead of incrementer 30, and the values 40, 41, 49, and 50 will need to be modified for a decrementing operation.

FIG. 3 describes a method 100 that may be performed by the circuitry of FIGS. 1 and 2. Method 100 begins at start oval 102 and proceeds to decision diamond 104 where the question is asked "has continuous power 48 been provided to timing circuitry 12?" If continuous power 48 (see FIG. 2) has not yet been provided to timing circuitry 12, timing circuitry 12 is not powered up and continues to wait until it receives continuous power 48 (see "NO" path from decision diamond 104). In the illustrated embodiment, once continuous power 48 is provided to timing circuitry 12, it is not removed. For example, in one embodiment, continuous power 48 may be provided by a backup battery or other dedicated power source. For some embodiments, if replacement of a backup battery is required, the flow 100 may begin again at start oval 102. Alternate embodiments may handle loss of continuous power 48 in a different manner; and yet other embodiments may disallow the loss of continuous power 48.

Referring again to decision diamond 104, if continuous power 48 has been provided to timing circuitry 12, timing circuitry 12 is now powered up and flow 100 proceeds to block 106 (see "YES" path from decision diamond 104). At block 106, timing circuitry 12 waits to receive a reset signal 47. In some embodiments, reset 47 is asserted in response to a predetermined event (e.g. IC 11 receiving the continuous power signal 48 for the first time). In the illustrate embodiment, the assertion of reset signal 47 causes the calibration history bit 39 to be cleared, causes the SRTC storage circuitry 37 to be loaded with its initial value 49, and causes the CV storage circuitry 32 to be loaded with its initial value 50 (see FIG. 2). From block 106, flow 100 proceeds to block 108 where the counter value in the SRTC storage circuitry 37 is incremented using incrementer 30.

From block 108, flow 100 then proceeds to decision diamond 110 where the question is asked "does SRT[15:0] equal $7FFF?". If the answer is no (see "NO" path from decision diamond 110), flow 100 proceeds to decision diamond 112 where the question is asked "does SRTC[15:0] equal $8020?". If the answer is no (see "NO" path from decision diamond 112), flow 100 proceeds to block 108. If the answer is yes (see "YES" path from decision diamond 112), flow 100 proceeds to block 114 where the calibration history bit 39 is cleared by asserting the clear history bit signal 43 (see FIG. 2). From block 114, flow 100 proceeds to block 108.

If the answer at decision diamond 110 is yes (see "YES" path from decision diamond 110), flow 100 proceeds to decision diamond 116 where the question is asked "does the calibration history bit equal zero?. If the answer is no (see "NO" path from decision diamond 116), flow 100 proceeds to block 108. If the answer is yes (see "YES" path from decision diamond 116), flow 100 proceeds to block 118 where the calibration value is selectively expanded. Note that in the illustrated embodiment, the calibration value is a signed number in signed 2's complement form. Alternate embodiments may not use 2's complement form to represent the calibration value. In addition, alternate embodiments may not use a signed number to represent the calibration value. Yet other embodiments may indicate the direction of calibration (i.e. whether the calibration value is to increase or decrease the counter value).

Referring to block 118, in the illustrate embodiment, the 5 bit calibration value CV[4:0] is expanded to a 16 bit expanded calibration value CV[15:0] in the following manner. If the sign bit CV[4] of the 2's complement calibration value equals zero (i.e. indicating that the calibration value CV[4:0] is a positive number), then CV[4:0] is expanded with %10000000000 as the most significant bits to form an expanded calibration value CV[15:0]. If the sign bit CV[4] of the 2's complement calibration value equals one (i.e. indicating that the calibration value CV[4:0] is a negative number), then CV[4:0] is expanded with %01111111111 as the most significant bits to form an expanded calibration value CV[15:0].

From block 118, flow 100 proceeds to block 120 where a portion of the counter value SRTC[46:16] is concatenated with the expanded calibration value CV[15:0]. In the illustrated embodiment, the expanded calibration value CV[15:0] bits are used as the least significant bits of the concatenated value; and the portion of the counter value, namely bits SRTC[46:16], are used as the most significant bits of the concatenated value. The concatenated value is stored in the SRTC storage circuitry 37. From block 120, flow 100 proceeds to block 122 where the calibration history bit 39 is set by negating the clear history bit signal 43. From block 122, flow 100 proceeds to block 108.

Figure 4:
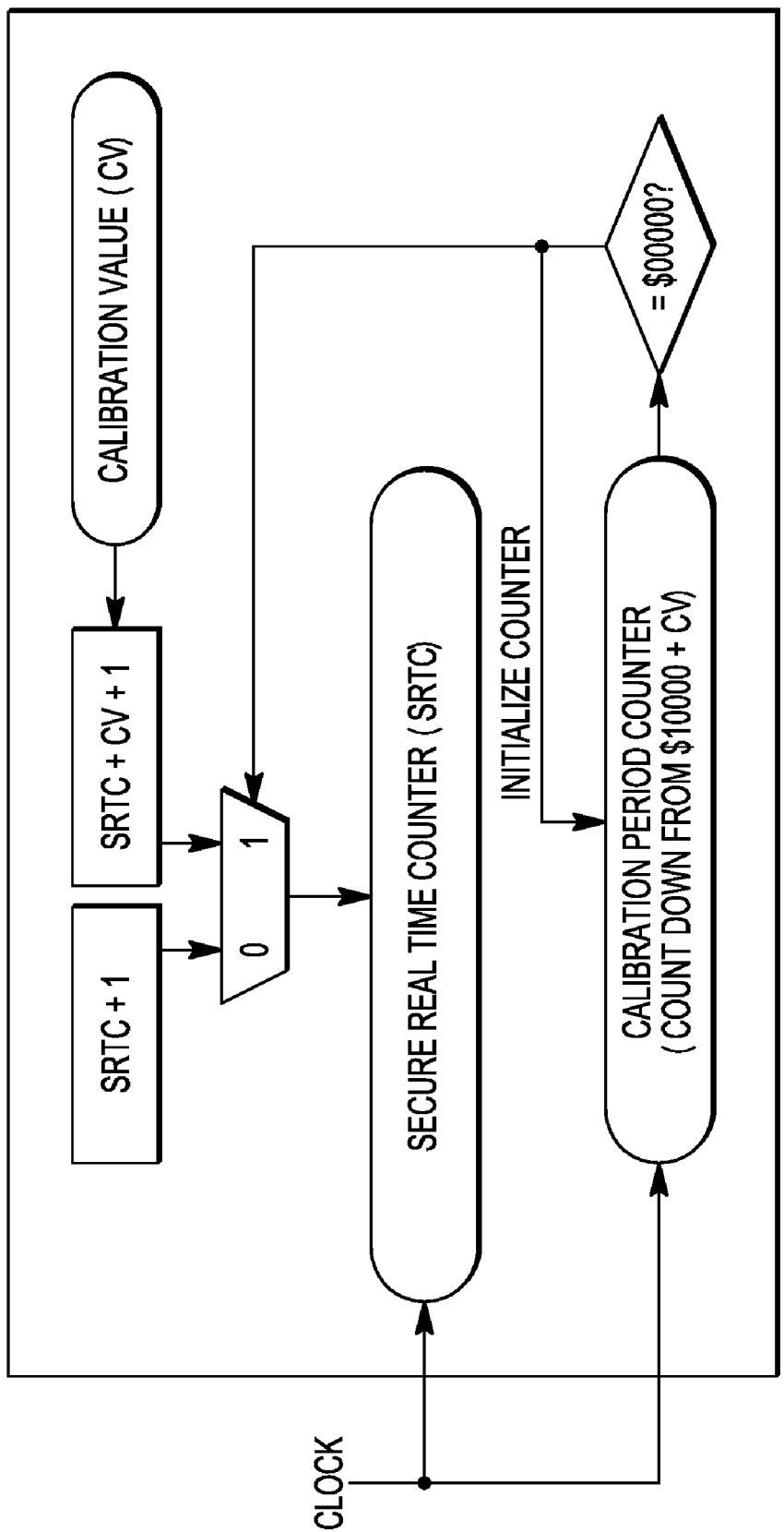
FIG. 4 illustrates, in partial block diagram from and partial schematic diagram form, a timing circuit in accordance with the prior art.

FIG. 4 illustrates a timing circuit in accordance with the prior art. After reset, the SRTC, the calibration period counter, and the SRTC are initialized. The initial value for the calibration period counter is $10000+CV. The calibration period counter is decremented by one. If the calibration period counter equals $00000, the SRTC value is incremented and the calibration value is also added to the SRTC value. If the calibration period counter does not equal $00000, the SRTC value is incremented and the calibration period counter is decremented. The calibration period counter is again checked to see if it equals $00000. Note that this circuit requires an adder to add the calibration value to the SRTC value as well as a calibration period counter. For application where the timing circuit remains powered up and consuming power at all times, this extra circuitry may drain a significant amount of power. This extra power drain due to the adder and calibration period counter may be prohibitive for some applications which use a timing circuit.

By now it should be appreciated that there has been provided low power counting circuitry 12 (FIGS. 1-3) that may be used in one embodiment to implement an accurate, secure real time clock. Counting circuitry 12 may use an incrementer 30 in combination with storage circuitry 37 to increment and store a counter value. A calibration value 32 may be expanded (e.g. by circuit 33) and combined (e.g. by circuit 34) with a portion of the counter value 37 for some embodiments. Control circuitry 35, 36, 38, 39 may be used to determine when calibration takes place. Note that a counter to count the calibration period is not required by circuitry 12. Also, an adder circuit is not required to add the calibration value. As a result, less power and less circuitry is required to operate the timing circuitry 12 of FIGS. 1-3

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Also for example, in one embodiment, the illustrated elements of system 10 are circuitry located on a single integrated circuit or within a same device. Alternatively, system 10 may include any number of separate integrated circuits or separate devices interconnected with each other. Also, system 10 or portions thereof may be soft or code representations of physical circuitry or of logical representations convertible into physical circuitry. As such, system 10 may be embodied in a hardware description language of any appropriate type.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, although some of the specific embodiments described herein describe counting circuitry 12 as "timing circuitry" that is counting time, alternate embodiments of counting circuitry 12 may count anything. Counting time is just one possible application of counting circuitry 12. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Additional Text

1. A counting circuit for example (12) comprising:
    first storage circuitry for example (37) which stores a count value;
    second storage circuitry for example (32) which stores a calibration value;
    match circuitry for example (38) coupled to the first storage circuitry which compares a first portion of the count value for example (SRTC[15:0]) with a first predetermined threshold for example ($7FFF), wherein when the first portion of the count value matches the first predetermined threshold, the match circuitry asserts a calibration signal for example (42) and when the first portion of the count value does not match the first predetermined threshold, the match circuitry negates the calibration signal for example (42); and
    count value update circuitry for example (30, 33, 34, 35) coupled to the first storage circuitry, the second storage circuitry, and the match circuitry, wherein the count value update circuitry:
        in response to the calibration signal being asserted and calibration being enabled for example (44), updates for example (120) the count value in the first storage circuitry using the calibration value,
        in response to the calibration signal being asserted and calibration being disabled for example (44), updates for example (108) the count value in the first storage circuitry using a predetermined step size, without using the calibration value, and
        in response to the calibration signal being negated, updates for example (108) the count value in the first storage circuitry using the predetermined step size, without using the calibration value.

2. The counting circuit of statement 1, or any other appropriate statement herein, further comprising:
    third storage circuitry for example (39) which stores a calibration history bit which, when asserted, indicates calibration is disabled and, when negated, indicates calibration is enabled, wherein the calibration history bit is asserted in response to the calibration signal being asserted.

3. The counting circuit of statement 2, or any other appropriate statement herein, wherein the match circuitry compares a second portion of the count value for example (SRTC[15:0]) with a second predetermined threshold for example ($8020), wherein when the second portion of the count value matches the second predetermined threshold, the match circuitry asserts a clear history bit signal for example (43) to negate the calibration history bit.

4. The counting circuit of statement 3, or any other appropriate statement herein, wherein the first portion and the second portion are a same least significant portion of the count value.

5. The counting circuit of statement 1, or any other appropriate statement herein, wherein the count value update circuitry comprises:
  expansion circuitry for example (33) which expands the calibration value to form an expanded value and wherein updating the count value using the calibration value comprises updating the count value using the expanded calibration value.

6. The counting circuit of statement 5, or any other appropriate statement herein, wherein the expansion circuitry expands the calibration value by sign extending the calibration value and toggling the most significant bit of the expanded calibration value.

7. The counting circuit of statement 5, or any other appropriate statement herein, wherein updating the count value in the first storage circuitry using the calibration value comprises combining a second portion of the counter value with the expanded calibration value and storing the combination of the second portion of the counter value and the expanded calibration value into the first storage circuitry to update the count value.

8. The counting circuit of statement 1, or any other appropriate statement herein, wherein updating the count value in the first storage circuitry using the predetermined step size, without using the calibration value, comprises adding for example (108) the predetermined step size to the count value and storing the result of the addition into the first storage circuitry to update the count value.

9. A counting circuit for example (12) comprising:
  first storage circuitry for example (37) which stores a count value;
  second storage circuitry for example (32) which stores a calibration value;
  third storage circuitry for example (39) which stores a calibration history bit which, when asserted for example (=1), indicates calibration is disabled and, when negated for example (=0), indicates calibration is enabled;
  match circuitry for example (38) coupled to the first storage circuitry which compares a first portion of the count value for example (SRTC[15:0]) with a first predetermined threshold for example ($7FFF) and a second predetermined threshold for example ($8020), wherein:
    when the first portion of the count value matches the first predetermined threshold, the match circuitry asserts a calibration signal for example (42) and when the first portion of the count value does not match the first predetermined threshold, the match circuitry negates the calibration signal for example (42), and
    when the first portion of the count value matches the second predetermined threshold, the match circuitry negates the calibration history bit to indicate calibration is enabled; and
  count value update circuitry for example (30, 33, 34, 35) coupled to the first storage circuitry, the second storage circuitry, and the match circuitry, wherein the count value update circuitry:
    in response to the calibration signal being asserted and the calibration history bit being negated, updates for example (118, 120) the count value in the first storage circuitry using the calibration value,
    in response to the calibration signal being asserted and the calibration history bit being asserted, updates for example (108) the count value in the first storage circuitry using a predetermined step size, without using the calibration value, and
    in response to the calibration signal being negated, updates for example (108) the count value in the first storage circuitry using the predetermined step size, without using the calibration value.

10. The counting circuit of statement 9, or any other appropriate statement herein, wherein when the first portion of the count value matches the first predetermined threshold for example (yes from 110) and the calibration history bit is negated for example (yes from 116), the matching circuitry asserts the calibration history bit to indicate calibration is disabled for example (122).

11. The counting circuit of statement 9, or any other appropriate statement herein, wherein the first portion of the count value is a least significant portion of the count value.

12. The counting circuit of statement 9, or any other appropriate statement herein, wherein the count value update circuitry comprises:
  expansion circuitry for example (33) which expands the calibration value to form an expanded value and wherein updating the count value using the calibration value comprises updating the count value using the expanded calibration value.

13. The counting circuit of statement 12, or any other appropriate statement herein, wherein updating the count value in the first storage circuitry using the calibration value comprises concatenating for example (34) a second portion of the counter value with the expanded calibration value and storing the concatenation of the second portion of the counter value and the expanded calibration value into the first storage circuitry to update the count value.

14. The counting circuit of statement 13, or any other appropriate statement herein, wherein the expansion circuitry for example (33) expands the calibration value to form the expanded value by sign extending the calibration value and toggling the most significant bit of the expanded calibration value.

15. A method for updating a count value, comprising:
  providing first storage circuitry for example (37) which stores a count value;
  providing second storage circuitry for example (32) which stores a calibration value;
  providing third storage circuitry for example (39) which stores a calibration history bit, which indicates whether calibration is enabled or disabled;
  comparing for example (110) a first portion of the count value for example (SRTC[15:0]) with a first predetermined threshold for example ($7FFF);
  when the first portion of the count value matches the first predetermined threshold for example (yes from 110) and the calibration history bit indicates that calibration is enabled for example (yes from 116), updating the count value in the first storage circuitry using the calibration value for example (118, 120); and
  when the first portion of the count value matches the first predetermined threshold for example (yes from 110) and the calibration history bit indicates that calibration is disabled for example (no from 116), updating the count value in the first storage circuitry using a predetermined step size, without using the calibration value for example (108).

16. The method of statement 15, or any other appropriate statement herein, further comprising:
when the first portion of the count value does not match the first predetermined threshold for example (no from 110), updating the count value in the first storage circuitry using the predetermined step size, without using the calibration value for example (108).

17. The method of statement 15, or any other appropriate statement herein, further comprising:
comparing for example (112) a second portion of the count value for example (SRTC[15:0]) with a second predetermined threshold for example ($8020);
when the second portion of the count value matches the second predetermined threshold for example (yes from 112), selectively updating the calibration history bit to indicate that calibration is enabled for example (114).

18. The method of statement 17, or any other appropriate statement herein, wherein when the first portion of the count value matches the first predetermined threshold for example (yes from 110) and the calibration history bit indicates that calibration is enabled for example (yes from 116), the method further comprises:
updating for example (122) the calibration history bit to indicate that calibration is disabled.

19. The method of statement 17, or any other appropriate statement herein, wherein the first portion and the second portion are a same least significant portion of the count value.

20. The method of statement 15, or any other appropriate statement herein, wherein updating the count value in the first storage circuitry using the calibration value further comprises:
expanding for example (118) the calibration value to form an calibration expanded value;
combining for example (120) a second portion of the counter value with the expanded calibration value; and
storing for example (120) the combination of the second portion of the counter value and the expanded calibration value into the first storage circuitry.

What is claimed is:

1. A counting circuit comprising:
first storage circuitry which stores a count value;
second storage circuitry which stores a calibration value;
match circuitry coupled to the first storage circuitry which compares a first portion of the count value with a first predetermined threshold, wherein when the first portion of the count value matches the first predetermined threshold, the match circuitry asserts a calibration signal and when the first portion of the count value does not match the first predetermined threshold, the match circuitry negates the calibration signal; and
count value update circuitry coupled to the first storage circuitry, the second storage circuitry, and the match circuitry, wherein the count value update circuitry:
in response to the calibration signal being asserted and calibration being enabled, updates the count value in the first storage circuitry using the calibration value,
in response to the calibration signal being asserted and calibration being disabled, updates the count value in the first storage circuitry using a predetermined step size, without using the calibration value, and
in response to the calibration signal being negated, updates the count value in the first storage circuitry using the predetermined step size, without using the calibration value.

2. The counting circuit of claim 1, further comprising:
third storage circuitry which stores a calibration history bit which, when asserted, indicates calibration is disabled and, when negated, indicates calibration is enabled, wherein the calibration history bit is asserted in response to the calibration signal being asserted.

3. The counting circuit of claim 2, wherein the match circuitry compares a second portion of the count value with a second predetermined threshold, wherein when the second portion of the count value matches the second predetermined threshold, the match circuitry asserts a clear history bit signal to negate the calibration history bit.

4. The counting circuit of claim 3, wherein the first portion and the second portion are a same least significant portion of the count value.

5. The counting circuit of claim 1, wherein the count value update circuitry comprises:
expansion circuitry which expands the calibration value to form an expanded value and wherein updating the count value using the calibration value comprises updating the count value using the expanded calibration value.

6. The counting circuit of claim 5, wherein the expansion circuitry expands the calibration value by sign extending the calibration value and toggling the most significant bit of the expanded calibration value.

7. The counting circuit of claim 5, wherein updating the count value in the first storage circuitry using the calibration value comprises combining a second portion of the counter value with the expanded calibration value and storing the combination of the second portion of the counter value and the expanded calibration value into the first storage circuitry to update the count value.

8. The counting circuit of claim 1, wherein updating the count value in the first storage circuitry using the predetermined step size, without using the calibration value, comprises adding the predetermined step size to the count value and storing the result of the addition into the first storage circuitry to update the count value.

9. A counting circuit comprising:
first storage circuitry which stores a count value;
second storage circuitry which stores a calibration value;
third storage circuitry which stores a calibration history bit which, when asserted, indicates calibration is disabled and, when negated, indicates calibration is enabled;
match circuitry coupled to the first storage circuitry which compares a first portion of the count value with a first predetermined threshold and a second predetermined threshold, wherein:
when the first portion of the count value matches the first predetermined threshold, the match circuitry asserts a calibration signal and when the first portion of the count value does not match the first predetermined threshold, the match circuitry negates the calibration signal, and
when the first portion of the count value matches the second predetermined threshold, the match circuitry negates the calibration history bit to indicate calibration is enabled; and
count value update circuitry coupled to the first storage circuitry, the second storage circuitry, and the match circuitry, wherein the count value update circuitry:

in response to the calibration signal being asserted and the calibration history bit being negated, updates the count value in the first storage circuitry using the calibration value, in response to the calibration signal being asserted and the calibration history bit being asserted, updates the count value in the first storage circuitry using a predetermined step size, without using the calibration value, and in response to the calibration signal being negated, updates the count value in the first storage circuitry using the predetermined step size, without using the calibration value.

10. The counting circuit of claim 9, wherein when the first portion of the count value matches the first predetermined threshold and the calibration history bit is negated, the matching circuitry asserts the calibration history bit to indicate calibration is disabled.

11. The counting circuit of claim 9, wherein the first portion of the count value is a least significant portion of the count value.

12. The counting circuit of claim 9, wherein the count value update circuitry comprises:
expansion circuitry which expands the calibration value to form an expanded value and wherein updating the count value using the calibration value comprises updating the count value using the expanded calibration value.

13. The counting circuit of claim 12, wherein updating the count value in the first storage circuitry using the calibration value comprises concatenating a second portion of the counter value with the expanded calibration value and storing the concatenation of the second portion of the counter value and the expanded calibration value into the first storage circuitry to update the count value.

14. The counting circuit of claim 13, wherein the expansion circuitry expands the calibration value to form the expanded value by sign extending the calibration value and toggling the most significant bit of the expanded calibration value.

15. A method for updating a count value, comprising:
providing first storage circuitry which stores a count value;
providing second storage circuitry which stores a calibration value;
providing third storage circuitry which stores a calibration history bit, which indicates whether calibration is enabled or disabled;
comparing a first portion of the count value with a first predetermined threshold;
when the first portion of the count value matches the first predetermined threshold and the calibration history bit indicates that calibration is enabled, updating the count value in the first storage circuitry using the calibration value; and
when the first portion of the count value matches the first predetermined threshold and the calibration history bit indicates that calibration is disabled, updating the count value in the first storage circuitry using a predetermined step size, without using the calibration value.

16. The method of claim 15, further comprising:
when the first portion of the count value does not match the first predetermined threshold, updating the count value in the first storage circuitry using the predetermined step size, without using the calibration value.

17. The method of claim 15, further comprising:
comparing a second portion of the count value with a second predetermined threshold;
when the second portion of the count value matches the second predetermined threshold, selectively updating the calibration history bit to indicate that calibration is enabled.

18. The method of claim 17, wherein when the first portion of the count value matches the first predetermined threshold and the calibration history bit indicates that calibration is enabled, the method further comprises:
updating the calibration history bit to indicate that calibration is disabled.

19. The method of claim 17, wherein the first portion and the second portion are a same least significant portion of the count value.

20. The method of claim 15, wherein updating the count value in the first storage circuitry using the calibration value further comprises:
expanding the calibration value to form an calibration expanded value;
combining a second portion of the counter value with the expanded calibration value; and
storing the combination of the second portion of the counter value and the expanded calibration value into the first storage circuitry.

* * * * *